(12) United States Patent
Traister et al.

(10) Patent No.: US 8,332,577 B2
(45) Date of Patent: Dec. 11, 2012

(54) PROGRAM CONTROL OF A NON-VOLATILE MEMORY

(75) Inventors: Shai Traister, San Jose, CA (US);
Jonathan Hsu, Newark, CA (US)

(73) Assignee: SanDisk Technologies Inc., Plano, TX (US)

( * ) Notice: Subject to any disclaimer, the term of this patent is extended or adjusted under 35 U.S.C. 154(b) by 655 days.

(21) Appl. No.: 12/316,159

(22) Filed: Dec. 10, 2008

(65) Prior Publication Data
US 2010/0146186 A1  Jun. 10, 2010

(51) Int. Cl.
*G06F 12/00* (2006.01)
*G06F 12/02* (2006.01)

(52) U.S. Cl. ........ 711/103; 711/150; 711/162; 711/165; 711/168; 711/169; 711/E12.001; 711/E12.008

(58) Field of Classification Search .......... 711/103, 711/150, 161–162, 165, 168–169, E12.001, 711/E12.008
See application file for complete search history.

(56) References Cited

U.S. PATENT DOCUMENTS

| | | | |
|---|---|---|---|
| 5,890,192 A | 3/1999 | Lee et al. | |
| 5,930,167 A | 7/1999 | Lee et al. | |
| 6,426,893 B1 | 7/2002 | Conley et al. | |
| 6,829,673 B2 * | 12/2004 | Lee et al. | 711/103 |
| 7,301,805 B2 | 11/2007 | Gorobets et al. | |
| 7,308,525 B2 | 12/2007 | Lasser et al. | |
| 7,461,199 B2 * | 12/2008 | Conley et al. | 711/103 |

* cited by examiner

*Primary Examiner* — Jasmine Song
(74) *Attorney, Agent, or Firm* — Brinks Hofer Gilson & Lione

(57) ABSTRACT

A method of storing data onto a non-volatile memory includes receiving, from a host, first data that is originally assigned to a first storage area, programming the first data to a second storage area, receiving second data from the host, and while receiving the second data from the host, programming, to the first storage area, the first data that has been programmed to the second storage area, wherein the second data is received from the host simultaneously with the first data being programmed to the first storage area. The second storage area is capable of having data stored thereon faster than the first storage area.

14 Claims, 6 Drawing Sheets

PROGRAM CONTROL OF A NON-VOLATILE MEMORY

FIELD OF THE INVENTION

The present invention relates to multiple programming of data associated with a non-volatile memory device and more specifically to non-volatile memory devices capable of storing more than one bit per cell.

BACKGROUND

Traditionally, digital information storage stored information by toggling each cell between two states; a neutral state and a charged state in what is called a single-level cell ("SLC") design. In non-volatile memory storage systems used today, it is a common practice to have memory chips capable of storing more than one bit per cell. Multi-Level Cell ("MLC") devices, for example, store more than one bit per cell, where each bit is associated with or belongs to another page.

In an MLC flash that is capable of storing two bits per cell, each cell has a neutral voltage and three levels of charged states, for a total of four different states capable of storing two bits of information. Each state is actually a voltage range and not a single voltage level. The cell's "state" is represented by the cell's threshold value that is required to allow conduction of current. Therefore, such an MLC cell supports four different valid ranges that correspond to four different states. An MLC flash that supports more than two bits per cell will have more than four possible states.

In such memory storage systems, data is typically programmed to multiple pages simultaneously. In other words, a group of pages may be programmed in parallel.

However, such implementation may result in the shortcoming that if only part of the group of pages of the flash memory are being programmed, the controller may have to wait until programming is finished to be able to start the programming of the rest of the pages of this group. Since the data could have been programmed to the entire group of pages at the same time, this results in performance degradation. This is particularly so during the substantially long upper data page programming, as described herein below with respect to FIGS. 1A and 1B.

FIGS. 1A and 1B (prior art) show threshold voltage distribution for a typical memory cell of an MLC memory device. Programming of an MLC memory device storing two bits per cell is applied in two steps—in the first step, a lower data page is programmed, and in the second step, an upper data page is programmed. An exemplary threshold voltage distribution associated with the programming of a lower data page is shown in FIG. 1A. An exemplary threshold voltage distribution associated with the programming of an upper data page is shown in FIG. 1B.

FIG. 1A (prior art) shows the threshold voltage distribution for programming a lower data page. FIG. 1A has two voltage distributions, each distribution corresponding to one state. The different distributions of the threshold voltage are used for encoding the values of the bits stored in the cell. The "X-axis" represents threshold value in Volts. The "Y-axis" represents number of cells in a memory array. Curve Er in FIG. 1A represents a distribution of the threshold values of the cells within the memory array that is in the erased data state Er, and curve A represents a distribution of the threshold values of the cells within the memory array that are in data state A.

In FIG. 1A, the graph's voltage distribution are labeled (from left to right) "1" and "0". This means that when a cell is in the erased data state Er (the first state from the left), it represents a "1" for the bit stored in this cell, and when the cell is in data state A, it represents a "0" for the bit stored in this cell. Note that encoding of states as presented herein is arbitrary, and other encoding schemes may hold.

FIG. 1B (prior art) shows the threshold voltage distribution for programming an upper data page of an MLC memory device. FIG. 1B has four voltage distributions, each distribution corresponding to one state. The different distributions of the threshold voltage are used for encoding the values of the bits stored in the cell. The "X-axis" represents threshold value in Volts. The "Y-axis" represents number of cells in a memory array of an MLC memory device. Curve Er in FIG. 1B represents a distribution of the threshold values of the cells within the memory array that is in the erased data state Er. In the same manner, curves A, B, C represent a distribution of the threshold values of the cells within the memory array that are in data states A, B, C, respectively.

In FIG. 1B, the graph's voltage distributions are labeled (from left to right) "11", "10", "00", "01", where the first binary digit represents the value stored in the lower data page, and the second binary digit represents the value stored in the upper data page. This means that when a cell is in the erased data state Er (the first state from the left), it represents a "1" for the lower bit and a "1" for the upper bit. When a cell is in state A, it represents a "1" for the lower bit and a "0" for the upper bit. When a cell is in state B, it represents a "0" for the lower bit and a "0" for the upper bit. When a cell is in state C, it represents a "0" for the lower bit and a "1" for the upper bit. Note that encoding of states presented herein is arbitrary, and other encoding schemes may hold.

Due to the distribution of the memory cells, average read and write times of an upper data page are longer than of a lower data page, resulting in worse performance. This is so since the difference between the threshold voltage ranges assigned to an upper data page is much smaller than in a lower data page (i.e., there is much less margin between the four data states of a two-bit cell than between the two data states of a single level cell). In other words, while using an MLC flash for storing more than one bit per cell allows more data storage per transistor—and is hence cheaper—reading more finely differentiated voltage ranges requires finer measurement, which is in turn slower and more error-prone.

A disturbance in the threshold value (i.e., leakage of stored charge causing a threshold voltage drift or interference from operating neighboring cells) that is insignificant in a lower data page because of the large gap between the two states, may cause erroneous programming of data onto an upper data page. This requires programming of an upper data page with an increased degree of precision, which typically takes longer time.

Therefore, if only part of a group of upper data pages of a flash memory is programmed, the controller may have to wait until the long programming finishes before the controller can commence programming the rest of the upper data pages in this group.

There is therefore a need to address programming of data associated with non-volatile memories in a way that would increase overall system performance.

SUMMARY

Embodiments, various examples of which are discussed herein, include a method of storing data onto a non-volatile memory. The method includes receiving, from a host, first data that is assigned to a first storage area; programming the first data to a second storage area, receiving second data from the host; and while receiving the second data from the host, programming, to the first storage area, the first data that has been programmed to the second storage area, wherein the second data is received from the host simultaneously with the first data being programmed to the first storage area. The second storage is capable of having data stored therein more quickly than the first storage area.

The first data may include a maximum amount of data capable of being programmed to a meta-page of a non-volatile memory, or may include less than the maximum amount of data capable of being programmed to a meta-page of a non-volatile memory. The meta-page may include multiple physical pages that are distributed across multiple planes. Alternatively or additionally, the meta-page may include multiple physical pages that are distributed over multiple storage devices.

If the first data includes less than a maximum amount of data capable of being programmed to a meta-page of a non-volatile memory, then the method may also include, subsequent to the programming of the first data to the second storage area and prior to the receiving of the second data, receiving additional data that is assigned to the first storage area; and programming the additional data to the second storage area. The programming of the first data to the first storage area includes programming a) the first data and b) the additional data that have been programmed to the second storage area to the first storage area. In such case, the first data and the additional data may be associated with the same command, or alternatively associated with separate commands. (This also applies to the case where the first data includes the maximum amount of data that may be programmed with one command.)

The first storage area may be an upper data page or a middle data page. The second storage area may be a lower data page, or a storage area that is configured as a binary block.

The method may also include, prior to programming the first data to the second storage area, copying data that is previously stored on the second storage area to a different storage area. The processing unit may also be operative to copy data that is previously stored on either the first or second storage areas to a different storage area prior to programming the first data to the first storage area (e.g., for situations where the second data is not sequential and pre-stored data would be copied to the slow memory area).

Also provided is a storage device that includes a non-volatile memory capable of storing data; and a controller that is operative to manage programming of data. The non-volatile memory has a first storage area and a second storage area, where the second storage is capable of having data stored therein more quickly than the first storage area. The program management performed by the controller includes: receiving, from a host, first data that is assigned to a first storage area; programming the first data to a second storage area, receiving second data from the host; and while receiving the second data from the host, programming, to the first storage area, the first data that has been programmed to the second storage area, wherein the second data is received from the host simultaneously with the first data being programmed to the first storage area.

The first data may include a maximum amount of data capable of being programmed to a meta-page of the non-volatile memory, or less than the maximum amount of data capable of being programmed to a meta-page of the non-volatile memory. Again, the meta-page may include multiple physical pages that are distributed across multiple planes of the non-volatile memory, and/or multiple physical pages that are distributed over multiple storage devices.

If the first data includes less than a maximum amount of data capable of being programmed to a meta-page of the non-volatile memory, then the controller may be operative, subsequent to programming the first data to the second storage area and prior to receiving the second data: to receive additional data that is assigned to the first storage area; and to program the additional data to the second storage area. The programming of the first data to the first storage area includes programming a) the first data and b) the additional data that have been programmed to the second storage area to the first storage area. In such case, the first data and the additional data may be associated with the same command, or alternatively associated with separate commands. (This also applies to the case where the first data includes the maximum amount of data that may be programmed with one command.)

The first storage area may be an upper data page or a middle data page. The second storage area may be a lower data page, or a storage area that is configured as a binary block.

With the storage device communicating with a host, the controller may be further operative to indicate to the host that it is ready to receive the second data. The controller may also copy data that is previously stored on the second storage area to a different storage area prior to the programming of the first data to the second storage area. The processing unit may also be operative to copy data that is previously stored on either the first or second storage areas to a different storage area prior to programming the first data to the first storage area (e.g., for situations where the second data is not sequential and pre-stored data would be copied to the slow memory area).

Also provided is a storage controller that includes an interface that is coupled to a non-volatile memory; and a processing unit that coupled to the interface and operative to manage programming of data content. Such program management includes: receiving, from a host, first data that is assigned to a first storage area; programming the first data to a second storage area, receiving second data from the host; and while receiving the second data from the host, programming, to the first storage area, the first data that has been programmed to the second storage area, wherein the second data is received from the host simultaneously with the first data being programmed to the first storage area. The second storage area is capable of having data stored therein more quickly than the first storage area.

The first data may include a maximum amount of data capable of being programmed to a meta-page of the non-volatile memory, or less than the maximum amount of data capable of being programmed to a meta-page of the non-volatile memory.

If the first data includes less than a maximum amount of data capable of being programmed to a meta page of the non-volatile memory, then the processing unit may be operative, subsequent to programming the first data to the second storage area and prior to receiving the second data: to receive additional data that is assigned to the first storage area; and to program the additional data to the second storage area. The programming of the first data to the first storage area includes programming a) the first data and b) the additional data that have been programmed to the second storage area to the first storage area. Again, in such case the first data and the additional data may be associated with the same command, or alternatively associated with separate commands. (This also applies to the case where the first data includes the maximum amount of data that may be programmed with one command.)

With the first data being available on the second storage area, the processing unit may be further operative to notify a host that it is ready to receive the second data. The processing unit may also be operative to copy data that is previously stored on the second storage area to a different storage area prior to programming the first data to the second storage area. The processing unit may also be operative to copy data that is previously stored on either the first or second storage areas to a different storage area prior to programming the first data to the first storage area (e.g., for situations where the second data is not sequential and pre-stored data would be copied to the slow memory area).

Additional features and advantages of the embodiments described are possible as will become apparent from the following drawings and description.

BRIEF DESCRIPTION OF THE DRAWINGS

For a better understanding of the invention with regard to the various embodiments, reference is made to the accompanying drawings, in which like numerals designate corresponding sections or elements throughout, and in which.

DETAILED DESCRIPTION

The embodiments and various aspects thereof are further described in more detail below. The description below is not intended to limit the scope of claims but instead to provide examples of such embodiments.

The following discussion therefore presents exemplary embodiments that provide an enhanced data management scheme for managing programming of data onto a non-volatile memory of a storage device. The data management scheme handles data that is assigned to a "slow" storage area by temporary storing this data onto a "fast" storage area. The data accumulated on the temporary "fast" storage area is then programmed to the designated "slow" storage area by using a single write command.

In the context of this disclosure, a "slow" storage area and a "fast" storage area refer to storage areas for storing data, where data is programmed onto the "fast" storage area faster than onto the "slow" storage area. For example, in an MLC memory device a "slow" storage area may include an upper data page or a middle upper page; and a "fast" storage area may include a lower data page or an MLC block that is managed or handled (i.e., erased, read, and programmed) as a single-level-cell ("SLC") block.

In one embodiment, a storage device may receive from a host data that is the maximum amount of data capable of being simultaneously programmed to a meta-page of its non-volatile memory. In a second embodiment, a storage device may receive from a host data that is less than the maximum amount of data capable of being simultaneously programmed to a meta-page of its non-volatile memory. The example embodiments handle manage programming of data that are associated with separate commands, or with the same command.

By "block" is meant herein the smallest group of memory cells that is physically erasable together in a single erase operation.

The term "page" (or "physical page") refers herein to the smallest portion of a storage area on a memory chip to which data can be written using one write (i.e., program) operation.

The term "planes" refer to any division of the blocks of a memory device into groups which allow simultaneous programming/reading/erasing of multiple blocks when no two blocks reside in the same plane. The ability of a device to support such capability may be the result of having multiple ICs or of having multiple planes within a single device.

By "meta-page" is meant herein to include one or more physical pages that are distributed among multiple logical or physical planes on the same storage device, or one or more physical pages that are distributed among multiple storage devices. By programming data to multiple pages that are linked together to form a meta-page, higher performance is obtained.

Figure 1A:
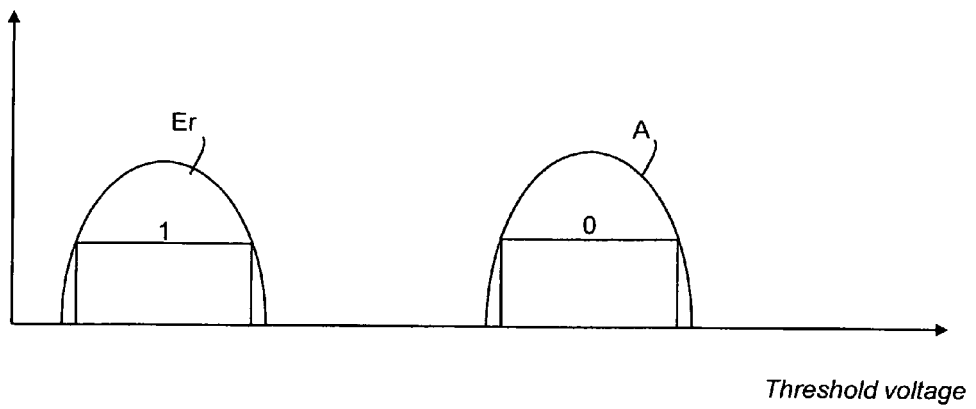
FIG. 1A (prior art) shows the threshold voltage distribution for a typical memory cell storing one bit per cell.
Figure 1B:
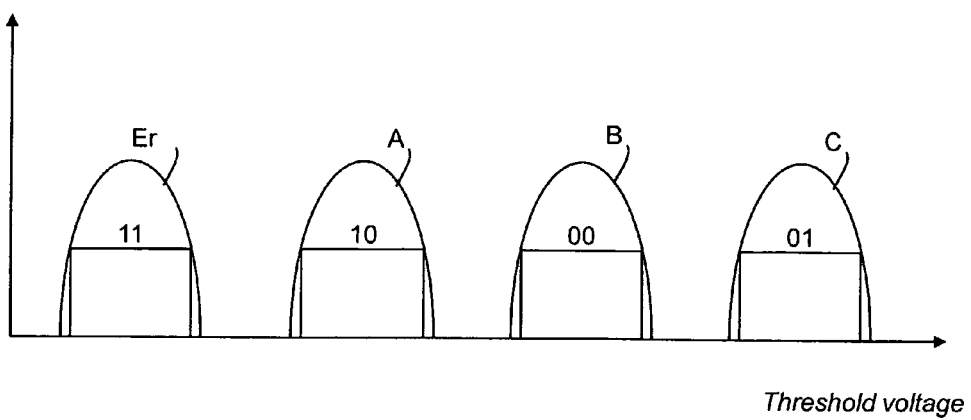
FIG. 1B (prior art) shows the threshold voltage distribution for a typical memory cell storing two bits per cell.
Figure 2:
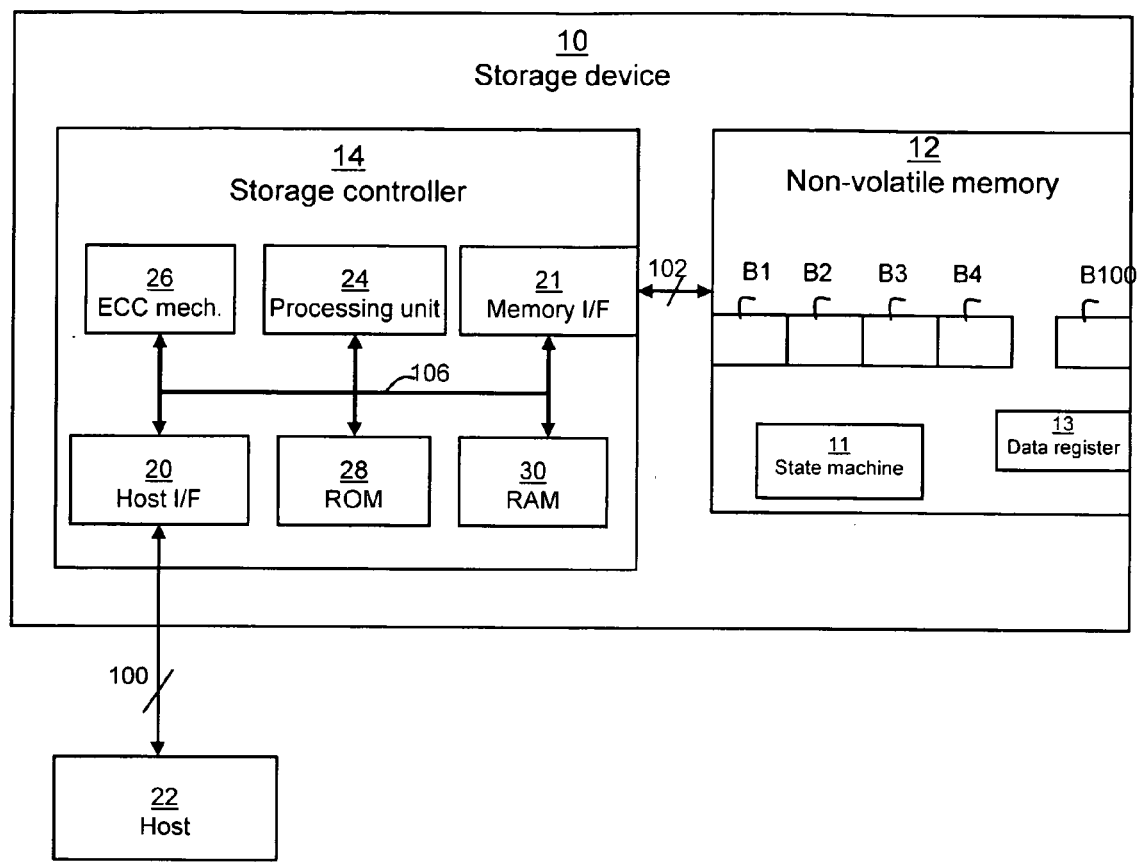
FIG. 2 is a block diagram of a storage device, according to an example embodiment.

FIG. 2 is a block diagram of a storage device 10 according to an example embodiment. Storage device 10 includes a non-volatile memory ("NVM") 12 (e.g., a FLASH memory) for storing data, and a storage controller 14 for managing storage operations associated with NVM 12.

NVM 12 may conform to any storage technology that has a "slow" storage area and a "fast" storage area. For example, non-volatile memory 12 may be, wholly or partly, an MLC device that is capable of storing more than one bit per cell.

Data may be stored on NVM 12 as blocks (e.g., as blocks B0, B1, B2, B3, B100). Each of blocks B0 through B100 may include multiple physical pages, as demonstrated, for example, in FIG. 3B.

Storage controller 14 includes a host interface 20 for interfacing with a host such as host 22 via data and control lines 100. Storage controller 14 also includes a memory interface 21 for interfacing with NVM 12 via data and control lines 102. Host interface 20 and memory interface 21 may conform to any communication protocol that is known today or that will be devised in the future.

Storage device 10 may be implemented as an embedded part of host 22, or it may be configured as a removable memory card that is connectable to host 22.

In general, storage controller 14 controls all the data transfers to/from NVM 12 and to/from host 22 by controlling, for example, "read", "write" and "erase" operations, and so on. With host 22 initiating commands, such as to store or to read data to or from non-volatile memory 12, storage controller 14 converts such commands into command signals and instruction codes that can be interpreted and executed by processing unit 24.

Storage controller 14 also includes an Error Correction Code ("ECC") mechanism 26, which utilizes an ECC algorithm for checking and correcting erroneous bits passing through storage controller 14, a read-only memory ("ROM") 28, and a random-access memory ("RAM") 30 that typically functions as a temporary storage area. All the units/components within storage controller 14 interoperate using a bus 106.

Processing unit 24 and ECC circuit 26 may be an integral part of, or be embedded within, storage controller 14, as shown in FIG. 2. Alternatively, processing unit 24 and/or ECC circuit 26 may be external to storage controller 14.

ROM 28 and RAM 30 may store a storage system firmware that includes, among other things, program instructions for controlling the operation of storage controller 14. Processing unit 24, which may be, for example, a microprocessor or a microcontroller, is provided for loading and executing program instructions that are stored on RAM 28 and/or ROM 30 and that are associated with data stored on NVM 12.

Note that data may be further encoded, decoded, scrambled, descrambled, compressed and/or decompressed before being written into, or read from, NVM 12. Any one of these processes may be applied by processing unit 24 directly, or by corresponding units communicating with processing unit 24.

Storage controller 14 manages the way data is programmed onto NVM 12 by managing programming of data that is assigned to a "slow" storage area in a way that optimizes the overall performance of host 22. A basic mode of operation is described as follows:

According to one embodiment, storage controller 14 receives from host 22 a maximum amount of data that can simultaneously be programmed to a meta-page of NVM 12. The maximum amount of data that can simultaneously be programmed to a meta-page, including the size of the meta-pages that are associated with NVM 12, are typically pre-defined in storage controller 14 during production.

For example, a memory arrangement will be discussed below, in which a meta-page includes four physical pages and each physical page includes 8 sectors of data. Typically, each sector holds 512 bytes of user data, including additional bytes that are used for internal data management.

Referring to the exemplary meta-page described above, a program command communicated from host 22 to storage controller 14 to program 32 sectors of data to NVM 12 would fill up the entire meta-page because, as stated above, the exemplary meta-page is capable of storing 32 sectors of data (i.e., 4 pages multiplied by 8 sectors/page) using one write operation. Hence, according to this example, 32 sectors of data include the maximum amount of data capable of being simultaneously programmed to this meta-page.

With NVM 12 being available for storing new data onto a "slow" storage area (e.g., an upper data page), storage controller 14 first programs this data to a "fast" storage area. The "fast" storage area functions as a temporary storage area. Then, storage controller 14 is free to receive new data from host 22 while it simultaneously programs the (previously received) data onto the designated "slow" storage area. Unlike methods in which the transfer of data from a fast to a slow memory occurs in the background while other memory operations are occurring or when the fast memory becomes full of data, this embodiment exploits the host transfer time (i.e., the time needed for the host to transfer data to the storage device) to transfer data from a fast to a slow memory while other data is being received from the host.

The temporary ("fast") storage area may be a lower data page on any other block of non-volatile memory 12 that is allocated thereto (block B100 for example). Alternatively, the temporary storage area may be an SLC (single-level cell) block that is configured as a binary block to store one bit per cell.

In case part of the data stored on the "fast" storage area is valid, storage controller 14 typically performs an operation for retaining the valid data before it programs new data. This may be done by storage controller 14 copying the valid data to a different block that is allocated thereto prior to programming the new data to the "fast" storage area.

A state machine 11 embedded within NVM 12 issues a status signal to storage controller 14 to indicate that the data is properly programmed on the "fast" storage area.

Responsive to the status signal, storage controller 14 sends a "Ready" signal to host 22 to indicate to host 22 that it is now ready to receive new data (second data) from host 22. While storage controller 14 is waiting for the new data, or during receipt thereof, it programs to the designated "slow" storage area the first data that has been temporarily programmed to the "fast" storage area. Note that programming of the first data to the "slow" storage area may take place during issuing of the Ready signal or immediately afterwards, or in response to an additional command from host 22.

According to another embodiment, storage controller 14 receives from host 22 an amount of data that is less than the maximum amount of data capable of being simultaneously programmed to a meta-page of NVM 12. With respect to the exemplary memory arrangement described above, since a program command from host 22 to program, for example, 16 sectors of data does not entirely fill up a meta-page, 16 sectors of data include less than the maximum amount of data capable of being simultaneously programmed to this meta-page.

Programming to storage device 10 data that includes less than the maximum amount of data typically necessitates multiple programming operations that could have been applied using one programming operation. For preventing such multiple programming operations, storage controller 14 programs partial data (first data) to a temporary "fast" storage area. Once storage controller 14 verifies that the first data is successfully programmed and available on the "fast" storage area, it sends a Ready signal to host 22 that indicates to host 22 that storage controller 14 can receive another (i.e., a second) data. The second data is then also programmed onto the temporary storage area.

Storage controller 14 typically programs data to the temporary ("fast") storage area until the data accumulated in the fast storage amounts to the maximum amount of data that can be simultaneously programmed to a meta-page. After the second data is available on NVM 12, storage controller 14 issues a Ready signal to indicate to host 22 that it is ready to receive new data.

Then, storage controller 14 exploits the time in which it receives the new (third) data from host 22 for simultaneously programming the (previously received) data that is stored on this temporary "fast" storage area (i.e., the first data and the second data) to the "slow" storage area. (In contrast, with some prior methods, data is transferred from a fast to a slow memory in the background while other memory operations are occurring or when the fast memory becomes full of data—not during the time the host transfers data to a storage device.) At this phase, storage controller 14 programs the previously received data to the "slow" storage area using a single write command.

If there is enough storage area on RAM 30, storage controller 14 may store the second data that it receives from host 22 onto RAM 30. Typically, if there is enough storage area on RAM 30, storage controller 14 stores the second data on RAM 30 in addition to storing this data on the temporary "fast" storage area on NVM 12. In such case, storage controller 14 does not need to read this data before programming it to the "slow" storage area. This makes the relatively long read operations associated with NVM 12 unnecessary, which improves the overall system performance.

Again, the first data and the second data may be associated with separate commands, or with the same command. With the first data and the second data being associated with separate commands, the second data may be received from host 22 at any time after the first data is received. As a result of this, the first data is retained on the "fast" storage area in case a power loss with host 22 occurs after the first data is programmed to the "fast" storage area, for example.

Again, storage controller 14 may program the first and second data to the "slow" storage area during the issuing of the Ready signal to host 22, immediately after issuing the Ready signal, or in response to an additional command from host 22.

Thus, higher system performance is achieved by employing data transfer times from host 22 to storage controller 14 in the way described herein, and by preventing partial programming of data that is assigned to a "slow" storage area.

Storage controller 14 may further use its extra processing time for performing other processes that do not require and/or involve access to NVM 12. Such processes may be applied in addition to, simultaneously with, or separately from managing programming of data from the "fast" storage area to the "slow" storage area internally within NVM 12. For example, while data is programmed to the upper data pages, storage controller 14 may access program instructions and other data that are stored internally on RAM 30.

Note that for data that is originally assigned to be stored onto a "fast" storage area, storage controller 14 may be configured to program this data directly to its designated ("fast") storage area, thus bypassing the need to program this data to a temporary storage area and/or to wait for additional data before programming this data to its designated storage area.

For shortening the program time of data onto non-volatile memory 22, storage controller 14 may utilize a command called "Program with Cache" for storing data on a data register 13 in a relatively short programming operation, while programming this data to its designated "slow" storage area in a relatively long programming operation. Using data register 13 as a buffer as such allows storage controller 14 to transfer the data of the next command (e.g., second data) to NVM 22 before completing the long programming operation of the first data to the "slow" storage area.

Figure 3A:
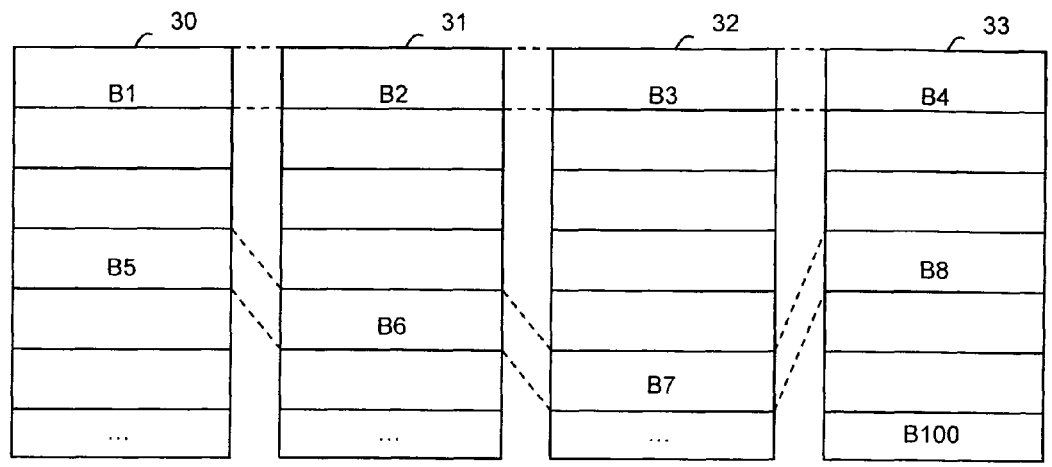
FIGS. 3A and 3B demonstrate linking physical pages to form a meta-page according to an example embodiment.
Figure 3B:
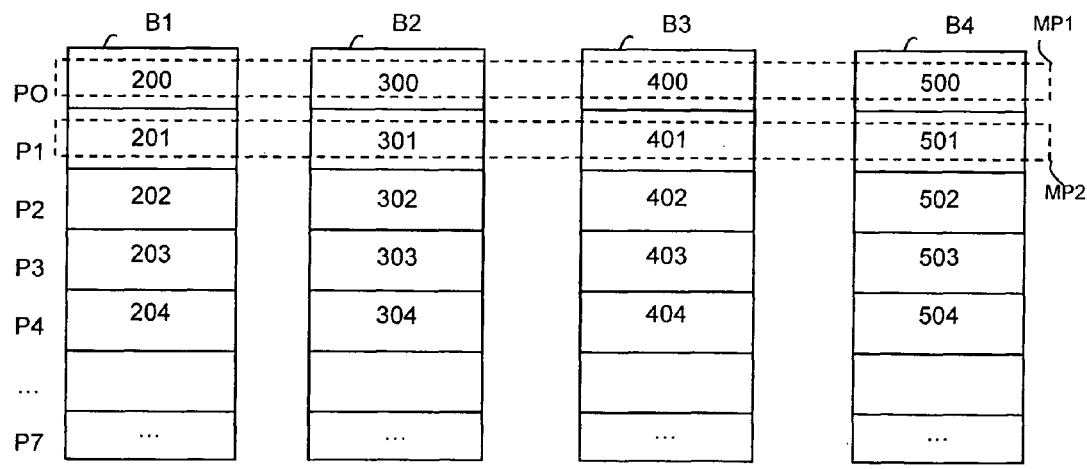

FIGS. 3A and 3B show data stored on a meta-page that is distributed across multiple planes of a non-volatile memory.

In FIGS. 3A and 3B, data is simultaneously programmed onto physical pages that are linked together to form a meta-page. Programming of data onto multiple planes that are distributed across one or more memory chips is described in more detail in U.S. Pat. Nos. 5,890,192 and 6,426,893, which are hereby incorporated by reference.

In FIG. 3A, data are stored on blocks that are distributed among multiple planes of a non-volatile memory. FIG. 3A will be described in association with FIG. 2, where NVM 12 is divided into four planes 30, 31, 32 and 33. It should be noted that NVM 12 may include any other number of planes, for example it may include 1, 2, 8, 16 planes, or more. Each of planes 30, 31, 32 and 33 includes a plurality of blocks. By way of example, plane 30 includes blocks B1 and B5, plane 31 includes blocks B2 and B6, and so on.

For increased performance, blocks B1 through B100 on NVM 12 can be operated in larger meta-blocks. By "meta-block" is meant herein a group of logically linked blocks, where each block of the group of blocks resides on a different plane. A meta-block may extend across one or more blocks in one or more planes within a storage device.

For example, four blocks B1 through B4 can be logically linked together to form one meta-block. In this example, the four blocks (i.e., blocks B1 through B4) have the same location within their respective planes 30 through 33. That is, block B1 is in the first (i.e., uppermost) location of plane 30; block B2 is in the uppermost location of plane 31; block B3 is in the uppermost location of plane 32; and block B4 resides in the uppermost location of plane 33. However, the blocks forming a meta-block can be in various locations within their respective planes. Four blocks B5 through B8, which form another meta-block, are located in different locations within their respective planes 30 through 33. That is, block B5 is in the fourth location on plane 30; block B6 is in the fifth location on plane 31; block B7 is in the sixth location on plane 32; and block B8 is in the fourth location on plane 33.

FIG. 3B shows data stored on physical pages that are linked together to form a meta-page. FIG. 3B will be described in association with FIG. 3A, where multiple physical pages of memory cells form a block and each block is associated with a different plane 30, 31, 32 or 33. Data can be stored on these physical pages in one or more bits per cell.

As shown in FIG. 3A, each of blocks B1, B2, B3, and B4 includes eight pages P0, P1, P2, P3, P4, P5, P6, and P7. Alternatively, there can be 16, 32, 64, 128, 192, 256 or more pages within block B1, B2, B3, or B4.

In this example, physical page P0 of block B1 includes a lower data page 200; physical page P1 of block B1 includes an upper data page 201; physical page P2 of block B1 includes a lower data page 202; physical page P3 of block B1 includes an upper data page 203, and so on. Physical page P0 of block B2 includes a lower data page 300; physical page P1 of block B2 includes an upper data page 301; physical page P2 of block B2 includes a lower data page 302; physical page P3 of block B2 includes an upper data page 303, and so on. Physical page P0 of block B3 includes a lower data page 400; physical page P1 of block B3 includes an upper data page 401; physical page P2 of block B3 includes a lower data page 402; physical page P3 of block B3 includes an upper data page 403, and so on. Physical page P0 of block B4 includes a lower data page 500; physical page P1 of block B4 includes an upper data page 501; physical page P2 of block B4 includes a lower data page 502; physical page P3 of block B4 includes an upper data page 503, and so on.

The lower data page in each physical page is typically the "fast" storage area, and the upper data page is typically the "slow" storage area of this physical page. It should be noted that the present disclosure is not limited to such memory arrangement, and each physical page may store more than two bits per cell.

Again for increased performance, the upper data page of each physical page may be logically linked to form one meta-page. In the same manner, the lower data page of each physical page may be linked together to form another meta-page.

In FIG. 3B, lower data pages 200, 300, 400, 500 (from page P0 of blocks B1 through B4 of respective planes 30 through 33) are logically linked together to form meta-page MP1. Upper data pages 201, 301, 401, 501 (from page P1 of blocks B1 through B4 of respective planes 30 through 33) are logically linked together to form meta-page MP2.

Figure 4:
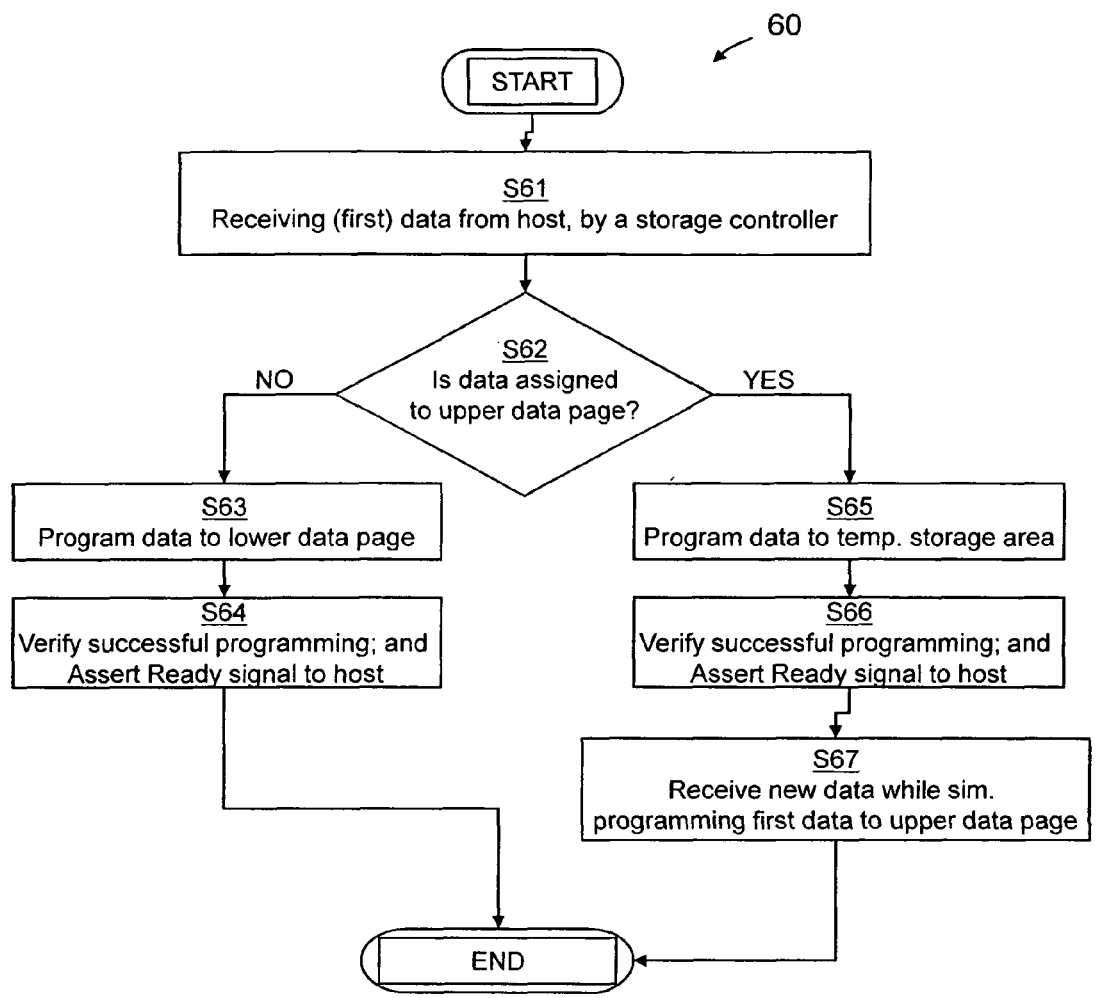
FIG. 4 is a method for storing data in a non-volatile memory according to an example embodiment.

FIG. 4 is a flow chart of a method 60 by which storage controller 14 of FIG. 2 controls or manages programming of data onto NVM 12 of storage device 10, according to an example embodiment. FIG. 4 will be described in association with NVM 12 of FIG. 2. In addition, it is assumed that the data received from host 22 includes a maximum amount of data that is capable of being simultaneously programmed to a meta-page of NVM 12.

At step S61, storage controller 14 receives data from host 22. At S62, storage controller 14 determines whether the received data is assigned to be stored to a meta-page that is associated with upper data pages (i.e., "slow" storage area) or to a meta-page that is associated with lower data pages (i.e., "fast" storage area) on NVM 12. Storage controller 14 may determine this by comparing the address of the received data with the address of the next available (i.e., not written) meta-page on NVM 12.

If storage controller 14 determines that the data is assigned to a "fast" storage area—such as lower data pages 200, 300, 400, 500 of meta-page MP1 (shown as "NO" at step S62), then, at step S63, storage controller 14 programs the data to its designated storage area. At step S64, storage controller 14 verifies that the data was successfully programmed and sends a Ready signal to notify the host that it is ready to receive new data.

However, if storage controller 14 determines that the data is assigned to a "slow" storage area—such as upper data pages 201, 301, 401, 501 of meta-page MP2 (shown as "YES" at step S62), then, at step S65, storage controller 14 programs the data to a temporary storage area. Again, the temporary storage area may be lower data pages of any block (block B100, for example) on NVM 12 that is allocated thereto and that is capable of having data stored therein more quickly than the upper data pages.

At step S66, storage controller 14 verifies that the data was successfully programmed to the temporary storage area and asserts a Ready signal to host 22 to notify the host that the data is available on NVM 12 and that it is now ready to receive new data.

The new data may be received as part of a separate command (at which case the previous command has ended and storage controller 14 now waits for receiving the next command from host 22). Alternatively, the new data (and first data) may be received as part of the same command.

At step S67, storage controller 14 receives new data from the host while it simultaneously programs to the designated ("slow") storage area, for example—upper data pages 201, 301, 401, 501 of meta-page MP2, the first data that has been previously programmed to the temporary storage area. Again, storage controller 14 may program the first data to the "slow" storage area immediately after it issues the Ready signal to host 22, or in response to an additional command from host 22.

Figure 5:
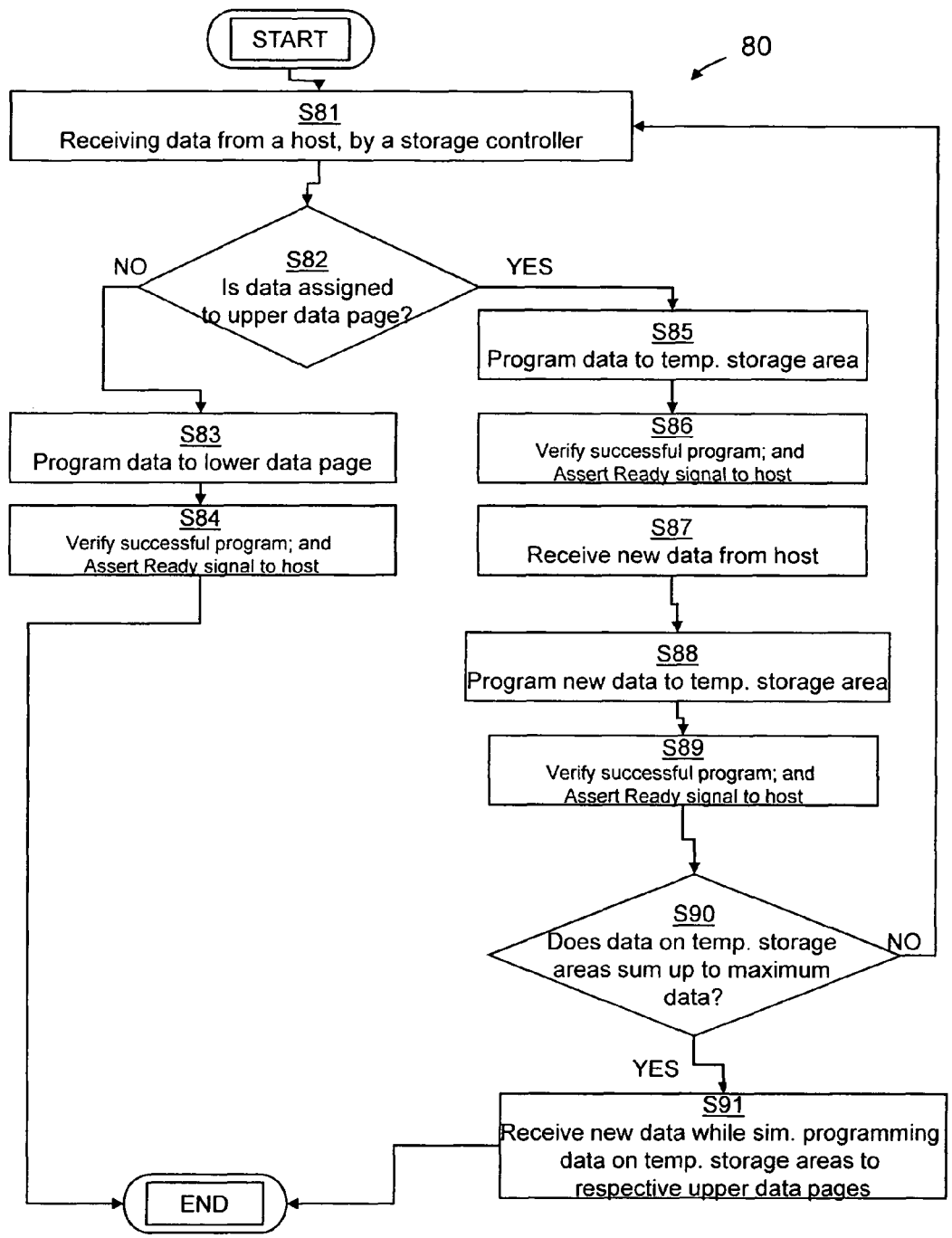
FIG. 5 is a method for storing data in a non-volatile memory according to another example embodiment.

FIG. 5 shows a flow chart of a method 80 by which storage controller 14 of FIG. 2 controls or manages programming of data onto NVM 12 of storage device 10, according to another example embodiment. FIG. 5 will be described in association with FIG. 2. In addition, it is assumed that data received from a host includes less than the maximum amount of data capable of being simultaneously programmed to a meta-page of NVM 12.

At step S81, storage controller 14 receives data (first data) from host 22. At step S82, storage controller 14 determines whether the data is assigned to an upper data page (i.e., "slow" storage area) or to a lower data page (i.e., "fast" storage area) on NVM 12.

In case this data is assigned to a "fast" storage area—such as lower data pages 200, 300 of meta-page MP1, then, at step S83 storage controller 14 programs the data to its designated storage area. At step S84, storage controller 14 verifies that the data is successfully programmed and asserts a Ready signal for notifying host 22 that it is ready to receive new data.

However, in case storage controller 14 determines that the data is assigned to a "slow" storage area (upper data page 201, 301 of meta-page MP2 for example), then, at step S85, storage controller 14 programs the data to a temporary storage area that is allocated thereto and that is capable of having data stored therein more quickly than the upper data pages. At step S86, storage controller 14 verifies that the data is successfully programmed and issues a Ready signal to host 22 to notify the host that the data is available on NVM 12 and that storage controller 14 is now ready to receive new data (second data).

At step S87, after the issuing of the Ready signal to the host, storage controller 14 receives new data (second data) from host 22. At this step S87, it is assumed that the first data and the second data are sequential data. Storage controller 14 may determine this according to the address of the received data. Note that with the first data including less than the maximum amount of data capable of being simultaneously programmed to a meta-page and with the new data (second data) being sequential data, the second data is necessarily assigned to one or more upper data pages (upper data pages 401, 501 for example) forming meta-page MP2 as well.

Storage controller 14 may receive the second data immediately after it issues the Ready signal to the host, or in response to an additional command from the host.

At step S88, storage controller 14 programs the new data (second data) to the temporary storage area.

At step S89, storage controller 14 verifies that the second data is successfully programmed on NVM 12 and asserts a Ready signal to the host to notify the host that the data is available on NVM 12 and that it (i.e., storage controller 14) is now ready to receive new data (third data).

Then at step S90, storage controller 14 determines whether the data (i.e., the first and second data) that is accumulated in the temporary storage area includes at least the maximum amount of data capable of being simultaneously programmed to meta-page MP2 of NVM 12.

In case the accumulated data include less than the maximum amount of data, the method returns to step S81 for receiving sequential data. Whereas, in case the accumulated data (in Bytes) sum up to the maximum amount of data, then, at step S91, storage controller 14 receives the new (third) data from the host while it simultaneously programs the first data and the second data (that have been previously programmed to the temporary storage area) to the entire meta-page MP2 using a single command.

Note that in case the first data and the new data (second data) are not sequential data, then storage controller 14 may, but need not necessarily, store the first data in the designated "slow" storage area along with data (other data) that is not stored in the second data. Storage controller 14 may store the first data and the other (previously stored) data in the designated "slow" at following addresses. This other data is typically pre-stored data that has been associated with an address that is sequential to the addresses of which the first data is associated with.

Figure 6A:
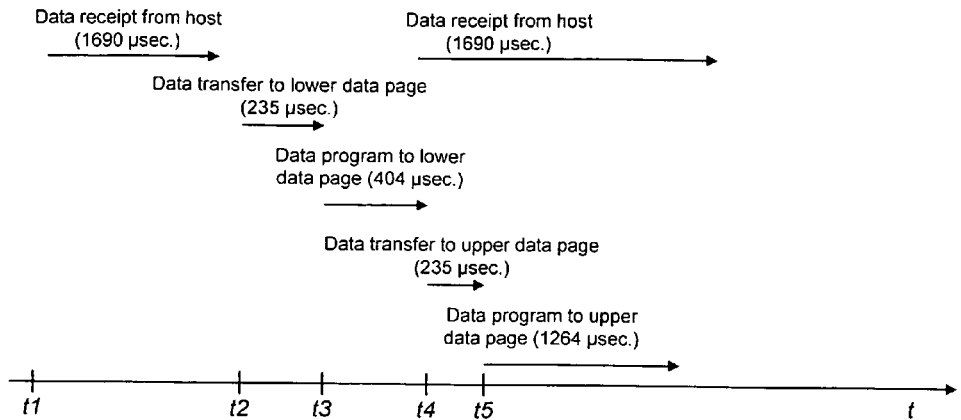
FIG. 6A is a timing diagram showing operational states of a storage controller, according to an exemplary embodiment.

FIG. 6A is a timing diagram showing operational states of a storage controller, according to an example embodiment. FIG. 6A will be described in association with FIG. 4. The "x" axis in FIG. 6A represents time in micro-seconds.

At time t1, storage controller 14 receives data from host 22. In this example, data transfer requires 1690 micro-seconds to complete. The data is assigned to upper data pages 201, 301, 401, 501 of meta-page MP2 for example and includes the maximum amount of data capable of being simultaneously programmed to a meta-page of NVM 12. Therefore, programming the data onto NVM 12 fills up the entire meta-page MP2.

Then at time t2, storage controller 14 transfers the data to NVM 12, an operation that may require, for example, another 235 micro-seconds. At time t3, storage controller 14 initiates the programming of this data to a temporary "fast" storage area on NVM 12. Such operation may require another 404 micro-seconds. Once the data is fully programmed and available on the temporary storage area, storage controller 14 issues a Ready signal back to the host as an indication that it is now ready to receive new data.

Then, at time t4, storage controller 14 begins to receive the new data from the host (1690 micro-seconds for example) while it simultaneously transfers the (previously received) data from the temporary storage area to upper data pages 201, 301, 401, 501 of meta-page MP2. Such data transfer may require another 235 micro-seconds. At time t5 (while still receiving the new data from the host), storage controller 14 manages the programming of the data onto upper data pages 201, 301, 401, 501 of meta-page MP2, for example.

As discussed above, the data management presented herein enables storage controller 14 to receive new data from the host while exploiting this time to simultaneously program previously received data to its designated storage area. As such, storage controller 14 need not wait for the programming of the data to its designated ("slow") storage area (i.e., upper data pages 201, 301, 401, 501 of meta-page MP2) to be completed before it is ready to receive new data. Since it is faster to transfer and to program data from a host to a lower data page, or to a memory block configured as an SLC block, than to transfer and program data to an upper data page, the time (e.g., the time elapsing from t2 to t4) when storage controller 14 is busy and cannot receive new data (and also the time when the host is unable to transmit new data) is decreased.

Figure 6B:
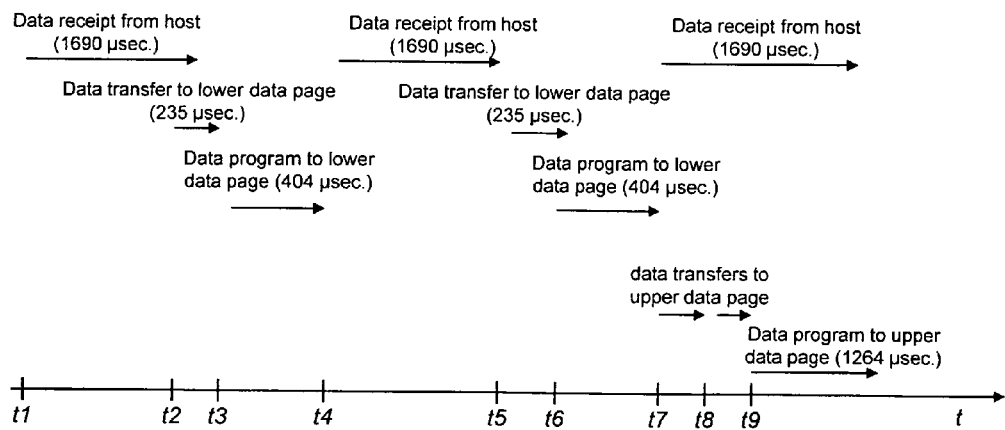
FIG. 6B is a timing diagram showing operational states of a storage controller according to another example embodiment.

FIG. 6B is a timing diagram showing operational states of a storage controller, according to another example embodiment. FIG. 6B will be described in association with the method of FIG. 5. The x-axis in FIG. 6B represents time in micro-seconds.

At time t1, storage controller 14 receives data from host 22. In this example, data is assigned to an upper data page of a physical page on NVM 12 (upper data pages 201, 301 forming meta-page MP2 for example) and includes less than the maximum amount of data capable of being simultaneously programmed to a meta-page of NVM 12. Again, such data transfer typically requires 1690 micro-seconds.

Then at time t2, storage controller 14 transfers the data to a temporary "fast" storage area on NVM 12. Such transfer may require another 235 micro-seconds. At time t3, storage controller 14 initiates the programming of this data to the temporary storage area (an operation that requires 404 micro-seconds, for example).

Once the data (first data) is fully programmed and available on the temporary storage area, storage controller 14 issues a Ready signal back to host 22 as an indication that it is now ready to receive additional data (second data). Since the first data includes less than the maximum amount of data capable of being simultaneously programmed to meta-page MP2, this data is stored on the temporary storage area until additional sequential data is received from host 22.

Then at time t4, storage controller 14 begins to receive the second data from host 22 (1690 micro-seconds for example). (Note that at this phase, the first data still remains stored on the temporary storage area). In this example, it is assumed that the second data and the first data are sequential data that together include the maximum amount of data capable of being simultaneously programmed to meta-page MP1 of NVM 12. For example, the second data is assigned to upper data pages 401, 501 of meta-page MP2.

At time t5, after the second data is received from host 22, storage controller 14 transfers the second data to the temporary storage area (an operation which requires 235 micro-seconds for example); and at time t6, storage controller 14 programs the second data onto the temporary storage area (an operation that requires another 404 micro-seconds). Once the second data is fully programmed and available on the temporary storage area, storage controller 14 issues another Ready signal back to host 22 as an indication that it is now ready to receive new data (third data this time).

Then at time t7, storage controller 14 begins to receive the third data from the host while simultaneously transferring the first data from temporary storage to upper data pages 201, 301 of meta-page MP2 (an operation which requires 235 micro-seconds for example). And at time t8, while storage controller 14 is still receiving the third data from host 22, storage controller 14 initiates the transfer of the second data from the temporary storage area to upper data pages 401, 501 of meta-page MP2 (an operation which requires another 235 micro-seconds, for example). As such, the data transfer times from host 22 to storage controller 14 is exploited for transferring data internally within NVM 12 and for preventing partial programming of data that is assigned to a "slow" storage area.

At time t9, storage controller 14 controls programming of the first data and the second data onto upper data pages 201, 301, 401, 501 of meta-page MP2. Since at this phase both the first data and the second data include the maximum amount of data capable of being simultaneously programmed to meta-page MP2 of NVM 12, the data is programmed to the upper data pages forming meta-page MP2 in a single program operation (an operation that requires 1264 micro-seconds, for example). In this example, storage controller 14 can receive the new data from host 22 while managing the programming of the first and second data.

Again, the time (e.g., the time elapsing between t2 and t4, and the time elapsing between t5 and t7) when storage controller 14 is busy managing data (and also the time when the host is unable to transmit new data) is decreased.

The storage device discussed herein may comply with any device technology known in the art that can directly connect to and communicate with a host. The storage device may have a non-volatile memory that retains its memory or stored state even when power is removed. Such non-volatile memory may comply with flash technology (e.g., NAND, NOR, Multi-Level Cell (MLC), Single-Level Cell (SLC), etc.), or with a variety of non-volatile memory structures and technology and/or memory card format (e.g., a secured digital ("SD") memory card format) used for storing multimedia content such as audio, video, or picture files, including for example erasable programmable read-only memory (EPROM), electrically-erasable programmable read-only memory (EE-PROM), read-only memory (ROM), and other memory technologies.

The storage device discussed herein may comply with any memory card format, including a secured digital memory card format, a multimedia card format, a compact flash ("CF") format, a flash PC (e.g., ATA Flash) format, a smartmedia format, a USB flash drive, a memory stick format, or with any other industry standard format.

Memory cards are used with various electronic devices. Some memory cards are referred to as "embedded" cards and some memory cards are referred to as "removable" cards, which means that they can easily be moved by an end-user from one electronic device to another, thereby rendering the digital data stored in them portable data. The memory cards can have a relatively small form factor and can be used to store digital data for electronic devices that require data storage, such as digital cameras, media players/recorders (e.g., MP3 players), Solid State Drives, hand-held or notebook computers, personal digital assistants (PDAs), cellular phones, network cards, network appliances, set-top boxes, and hand-held or other devices.

Nonetheless, the present disclosure may employ any mass storage device, whether it is a removable storage device that is configured for connection to and removal from the host or a dedicated storage device that is embedded within a host.

The host discussed herein may be a personal computer, a notebook computer, a hand held computing device, such as a PDA (Personal Digital Assistant) or mobile handset, a cellular telephone, a camera, an audio reproducing device, or any other electronic device that work with removable data storage. A host may have various personal information management applications, such as an address book, a daily organizer, and electronic notepads, to name a few.

As will be appreciated, various embodiments can employ a wide variety of architectures and it is expected that new architectures will continue to be developed. In general, the exemplary embodiments may be employed in conjunction with any suitable type of storage device or storage controller, provided that a storage device and a storage controller being used has suitable interface connections and suitable storage and management capabilities. It can be seen that the embodiments, various examples of which are described herein, may be realized in hardware, software, firmware or any combination thereof. A typical combination of hardware and software could be a general purpose computer system with a computer program that, when being loaded and executed, controls the computer system such that it carries out the transitioning described herein.

Having described herein various embodiments of a storage device, a storage controller and a method thereof, it is to be understood that the description is not meant as a limitation. Indeed, further modifications will now suggest themselves to those skilled in the art, and it is intended to cover such modifications as falling within the scope of the appended claims.

The invention claimed is:

1. A method of storing data onto a non-volatile memory, comprising:
    receiving, from a host, first data that is assigned to a first storage area;
    programming the first data to a second storage area, the second storage area being capable of having data stored therein more quickly than the first storage area;
    receiving second data from the host; and
    while receiving the second data from the host, programming, to the first storage area, the first data that has been programmed to the second storage area, wherein the second data is received from the host simultaneously with the first data being programmed to the first storage area;
    wherein if the first data includes less than a maximum amount of data capable of being programmed to a meta-page of a non-volatile memory, the method further comprises:
        subsequent to the programming of the first data to the second storage area and prior to the receiving of the second data, receiving additional data that is assigned to the first storage area, and programming the additional data to the second storage area,
        wherein the programming of the first data to the first storage area includes programming a) the first data and b) the additional data that have been programmed to the second storage area to the first storage area.

2. The method of claim 1, wherein the meta-page includes multiple physical pages that are distributed across multiple planes.

3. The method of claim 1, wherein the meta-page includes multiple physical pages that are distributed over multiple storage devices.

4. The method of claim 1, wherein the first data and the additional data are associated with a same command.

5. The method of claim 1, wherein the first data and the additional data are associated with separate commands.

6. A storage device, comprising:
    a non-volatile memory capable of storing data, the non-volatile memory having a first storage area and a second storage area, the second storage area being capable of having data stored therein more quickly than the first storage area; and
    a controller that is operative to manage programming of data, which program management includes: receiving, from a host, first data that is assigned to the first storage area, programming the first data to the second storage area, receiving second data from the host; and while receiving the second data from the host, programming, to the first storage area, the first data that has been programmed to the second storage area, wherein the second data is received from the host simultaneously with the first data being programmed to the first storage area;
    wherein if the first data includes less than a maximum amount of data capable of being programmed to a meta-page of the non-volatile memory, the controller is operative, subsequent to programming the first data to the second storage area and prior to receiving the second data: to receive additional data that is assigned to the first storage area, and to program the additional data to the second storage area, wherein the programming of the first data to the first storage area includes programming a) the first data and b) the additional data that have been programmed to the second storage area to the first storage area.

7. The storage device of claim 6, wherein the meta-page includes multiple physical pages that are distributed across multiple planes of the non-volatile memory.

8. The storage device of claim 6, wherein the meta-page includes multiple physical pages that are distributed over multiple storage devices.

9. The storage device of claim 6, wherein with the storage device communicating with the host, the controller is further operative to indicate to the host that it is ready to receive the additional data.

10. The storage device of claim 6, wherein the first data and the additional data are associated with a same command.

11. The storage device of claim 6, wherein the first data and the additional data are associated with separate commands.

12. A storage controller comprising:
    an interface being coupled to a non-volatile memory; and
    a processing unit coupled to the interface and operative to manage programming of data content, which program management includes: receiving, from a host, first data that is assigned to a first storage area on the non-volatile memory, programming the first data to a second storage area on the non-volatile memory, receiving second data from the host; and while receiving the second data from the host, programming, to the first storage area, the first data that has been programmed to the second storage area, wherein the second data is received from the host simultaneously with the first data being programmed to the first storage area,
    wherein the second storage area is capable of having data stored therein more quickly than the first storage area;
    wherein if the first data includes less than a maximum amount of data capable of being programmed to a meta page of the non-volatile memory, the processing unit is operative, subsequent to programming the first data to the second storage area and prior to receiving the second data: to receive additional data that is assigned to the first storage area, and to program the additional data to the second storage area, wherein the programming of the first data to the first storage area includes programming a) the first data and b) the additional data that have been programmed to the second storage area to the first storage area.

13. The storage controller of claim 12, wherein the first data and the additional data are associated with a same command.

14. The storage controller of claim 12, wherein the first data and the additional data are associated with separate commands.

* * * * *